United States Patent [19]

Everhart et al.

[11] Patent Number: 4,739,253

[45] Date of Patent: Apr. 19, 1988

[54] METHODS OF AND SYSTEM FOR RECEIVING TRANSMITTING OSCILLOSCOPE SIGNALS

[75] Inventors: Robert W. Everhart, Columbus; Charles T. Huck, Gahanna, both of Ohio

[73] Assignee: American Telephone and Telegraph Company, AT&T Technologies, Inc., Berkeley Heights, N.J.

[21] Appl. No.: 883,587

[22] Filed: Jul. 9, 1986

Related U.S. Application Data

[62] Division of Ser. No. 709,490, Mar. 7, 1985, Pat. No. 4,695,836.

[51] Int. Cl.[4] .................... G01R 13/32; G01R 13/26; G09G 1/06
[52] U.S. Cl. .................. 324/121 R; 324/111; 324/112; 340/722; 364/487
[58] Field of Search ........... 324/111, 112, 102, 121 R, 324/77 B; 364/487, 521; 179/2 A; 340/870.21, 347 SH, 722, 728, 720; 379/93, 96

[56] References Cited

U.S. PATENT DOCUMENTS

| | | | |
|---|---|---|---|
| 3,958,235 | 5/1976 | Duffy | 379/93 X |
| 4,038,668 | 7/1977 | Guarton | 340/722 X |
| 4,142,146 | 2/1979 | Schumann et al. | 324/121 R X |
| 4,225,940 | 9/1980 | Moriyasu et al. | 364/900 X |
| 4,555,765 | 11/1985 | Crooke et al. | 324/121 R X |
| 4,602,127 | 7/1986 | Neely et al. | 379/96 X |
| 4,616,175 | 10/1986 | Hanmura | 324/121 R |
| 4,659,876 | 4/1987 | Sullivan et al. | 379/96 X |

Primary Examiner—Ernest F. Karlsen
Assistant Examiner—Vinh P. Nguyen
Attorney, Agent, or Firm—Dwight A. Marshall

[57] ABSTRACT

A system for transmitting traces of an oscilloscope (16) to a remote location. A transmitter circuit (18) digitizes and transmits the traces to the remote location. A receiver circuit (24) at the remote location receives the transmitted signals and delivers these signals to a destination oscilloscope (26). At the transmitting location, the vertical output signal of the oscilloscope is amplified and fed to an analog-to-digital converter. The digitized output signal of the converter and the oscilloscope's timebase gate signal are stored in a memory circuit and subsequently transmitted to the remote location via a first modem (20). At the remote location, the receiver circuit (24) comprises a universal asynchronous receiver transmitter (UART) interfacing with a second modem (22), a memory circuit for storing the transmitted signals, and associated circuitry for restoring the oscilloscope signal's amplitude. The timebase gate signal of the transmitting oscilloscope (16) is used to trigger the destination oscilloscope (FIG. 1).

16 Claims, 4 Drawing Sheets

METHODS OF AND SYSTEM FOR RECEIVING TRANSMITTING OSCILLOSCOPE SIGNALS

This is a division of application Ser. No. 709,490, filed Mar. 7, 1985, now U.S. Pat. No. 4,695,836.

TECHNICAL FIELD

This invention relates to methods of and system for transmitting oscilloscope signals and more particularly to methods of and systems for capturing continuous or transient oscilloscope signals in real-time and transmitting the signals to a remote location utilizing a telephone system.

BACKGROUND OF THE INVENTION

It is frequently desirable to monitor local oscilloscope traces at a remote location in near real-time. This situation arises in telephone central offices served by remote technical service centers when there is a defect in one or more of the electrical circuits of a switching system and time is of the essence in restoring the system to full operation. Oftentimes in providing emergency service for telephone systems, a craftsperson is required to verbally describe over a telephone line the traces appearing on an oscilloscope screen to a repairman at the remote location. The manner in which the craftsperson describes the traces to the repairman can be time consuming and confusing and may result in unnecessary delay in restoring the system to full operation. Moreover, this problem becomes more difficult when the problem is sporadic in nature.

U.S. Pat. No. 3,958,235, which issued to F. A. Duffy, discloses a light emitting diode display apparatus wherein a plurality of diodes mounted in a row on a vibrating member are used to create a display for various types of signals. The display apparatus includes a member having a plurality of light emitting devices arranged in a row, an arrangement for moving the member at a predetermined rate, and an electronic circuit for applying energization action signals to selected ones of the plurality of light emitting devices in response to an input signal. The apparatus can also be configured so that signals, which are processed by a first circuit, are transmitted to a remote location over direct-coupled lines or telephone lines. This apparatus does not allow for the capture and retention of signals transmitted to the remote site nor is it able to operate at relatively high frequencies.

Accordingly, there is a need for a system which operates at relatively high frequencies, allows real-time acquisition of signals and captures and stores sporadic signals for analysis.

SUMMARY OF THE INVENTION

This invention relates to a real-time data acquisition and communication system which includes means for generating vertical and horizontal component signals in response to a continuous or transient analog signal, first means for converting each of the component signals into digital equivalent signals, means, responsive to the first converting means, for storing the digital equivalent signals and means for transmitting the digital equivalent signals to a remote location. The system further includes second means for storing the digital equivalent signals at the remote location and second means, responsive to the second storing means, for converting the digital equivalent signals into an analog signal.

The invention further includes systems for and methods of transmitting oscilloscope signals from a light location to a second location. Vertical channel and time base signals, associated with an oscilloscope signal to be transmitted, are generated. A trace signal is developed in response to the time base gate signal. The vertical channel and time base signals are converted into digital equivalent signals and are stored in a memory circuit. The stored digital equivalent signals, in response to the complement of the trace signal, are then transmitted to a second location.

Additionally, the invention includes systems for and methods of receiving oscilloscope signals. Digital equivalent signals, which are generated at a remote location, are stored in a memory circuit. The stored digital equivalent signals are converted into analog vertical channel and time base gate component signals. Thereafter, an oscilloscope signal is displayed on a display means in response to the vertical channel and time base gate signals.

DESCRIPTION OF THE DRAWINGS

Figure 1:
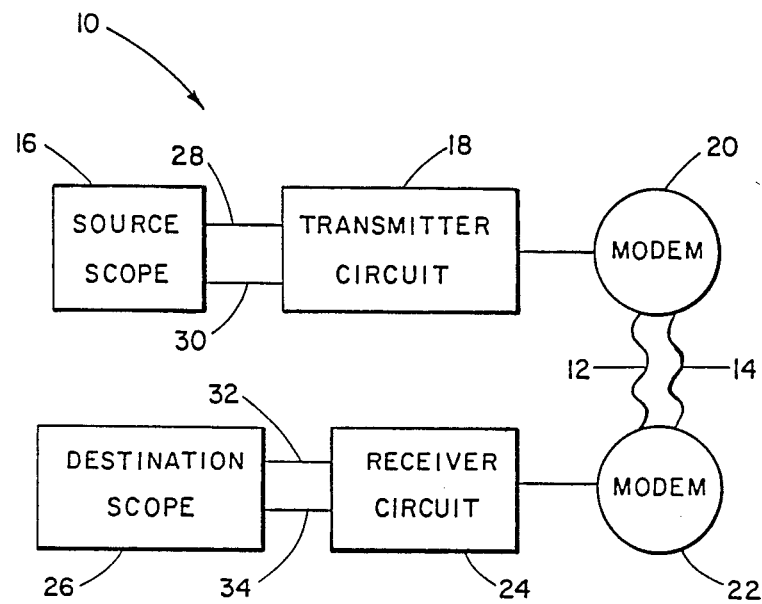
FIG. 1 is a block diagram of a data acquisition system in accordance with an embodiment of the invention.

Referring to FIG. 1, there is shown a block diagram of a system, designated generally by the system 10, which enables the capture of relatively high speed continuous or transient oscilloscope signals in real-time and transmission via lines 12 and 14 to a remote location. For purposes of illustration and not limitation, high speed signals refer to signals having a frequency of 5 MHz. Moreover, system 10 is able to capture non-repetitive, single-shot signals in real-time and transmit such signals to a remote location for storage and display thereat. System 10 includes a source oscilloscope 16, a transmitter circuit, designated generally by the numeral 18, a pair of modems 20 and 22, a receiver circuit, designated generally by the numeral 24, and a destination oscilloscope 26. Time base gating and vertical channel component signals associated with a continuous or a transient oscilloscope trace being displayed on a source oscilloscope 16 are fed to the transmitter circuit 18 over lines 28 and 30, respectively. The transmitter circuit 18 amplifies, digitizes, and stores digital equivalent signals representing the vertical channel signal present on line 30. The transmitter circuit 18 also generates and stores a positive logic signal which represents the time base gating signal present on line 28. The transmitter circuit 18 then automatically switches to a transmit mode and transfers, via the modem 20 and lines 12 and 14, the signals to a remote site when the storage of the vertical channel and the time base gating signals has been completed. Thereafter, the receiver circuit 24, located at the remote site, restores the signals to a representative of their original analog state and then feeds the vertical channel and the time base gating signals to the destination oscilloscope 26 over lines 32 and 34, respectively.

Figure 2:
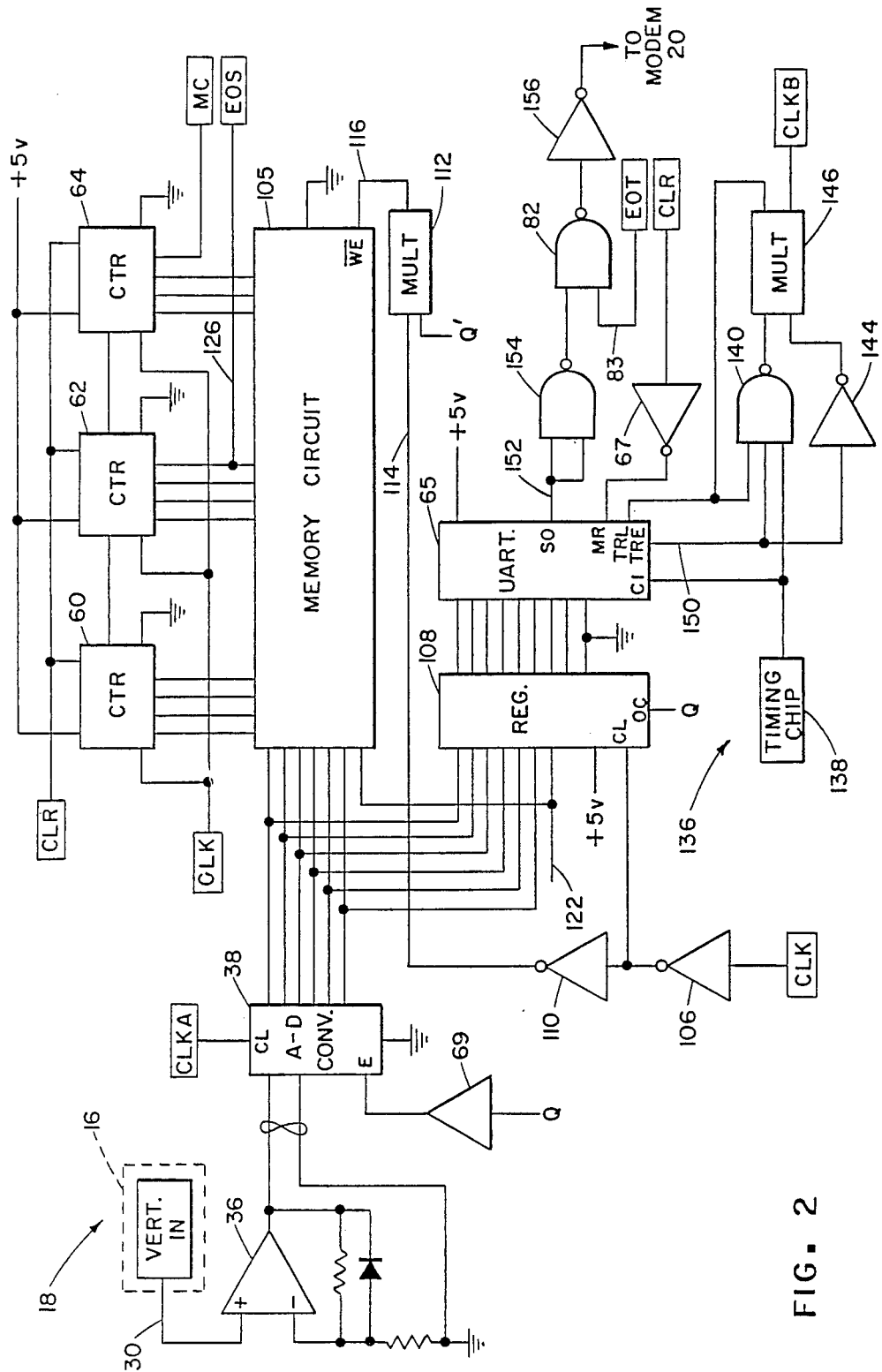
FIGS. 2 through 4 are schematic diagrams of various circuit elements of the data acquisition system of FIG. 1.
Figure 3:
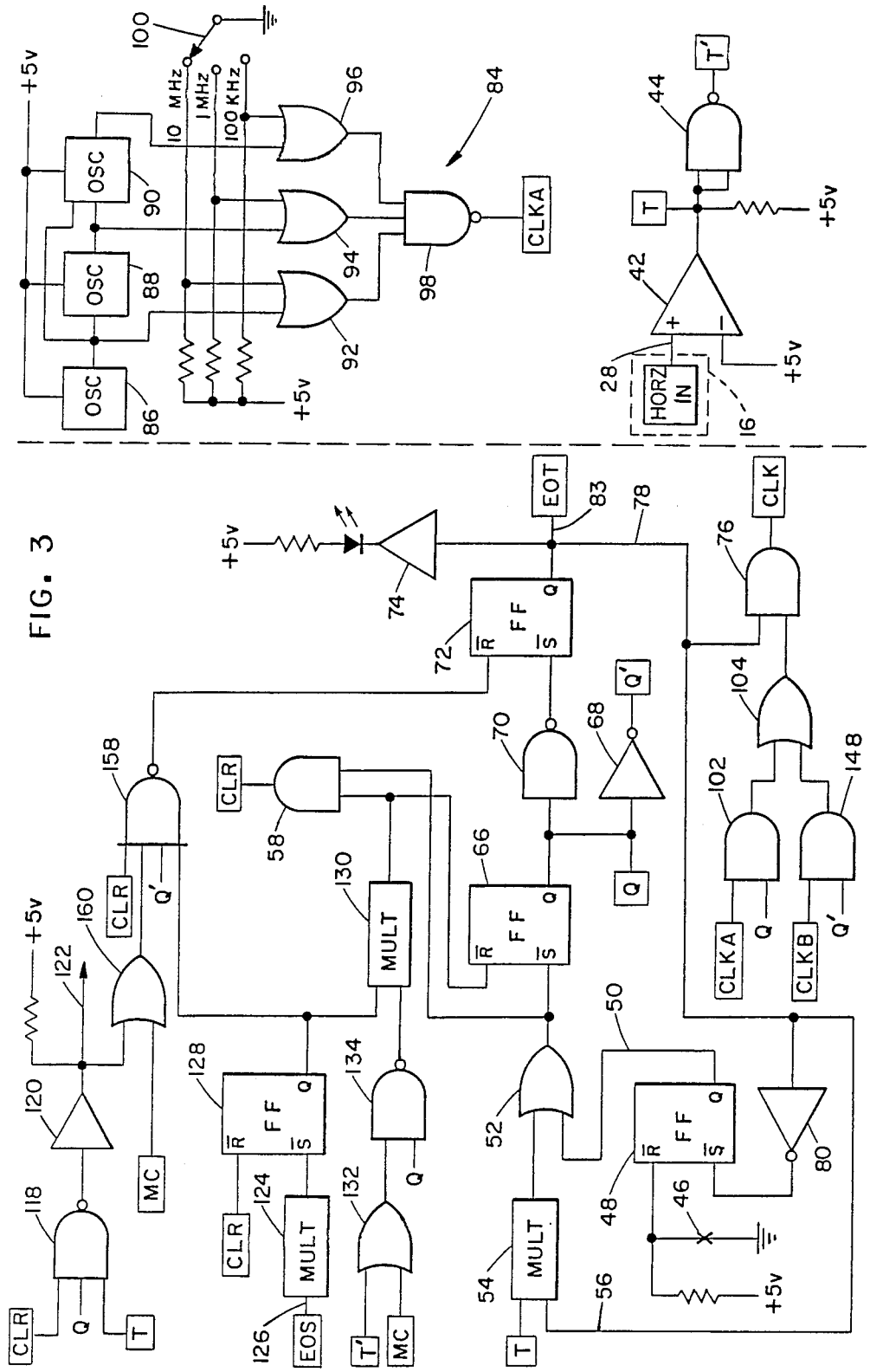

Referring to FIGS. 2 and 3, there is shown a detailed schematic representation of the transmitter circuit 18. As noted above, the vertical channel signal is fed to the transmitter circuit 18 over line 30 in real-time. The vertical channel component signal, which is amplified by a wideband amplifier 36, is fed to a high speed analog-to-digital (A-to-D) converter 38.

The time base gating component signal present on line 28 in FIG. 3 is fed to a high speed comparator 42 in order to generate a normalized positive logic signal which is equivalent to the trace time of source oscilloscope 16 and which hereinafter will be referred to as the trace pulse T. The output of comparator 42 is coupled to an inverter 44 in order to generate another positive logic signal which is equivalent to the retrace time of oscilloscope 16 and which hereinafter will be referred to as the retrace pulse T'.

When a signal is to be transmitted to the remote site, an operator positions the signal on the source oscilloscope 16 so that the entire signal appears in the upper half of the oscilloscope's screen. The operator then momentarily depresses a start switch 46 which resets flip-flop 48 and causes a low signal to appear on output line 50 thereof. The low signal appearing on output line 50 is fed to an input of an OR gate 52. The activation of the switch 46 and the resetting of the flip-flop 48 guarantee the storage of the signals in the transmitter circuit 18 always starts at the beginning of the trace pulse T. Moreover, this action allows for the capture or storage of single shot events. The trace pulse T, which appears on the output of comparator 42, is fed to an input of a multivibrator 54. The output of the multivibrator 54, which is enabled by a low signal appearing on line 56, momentarily shifts to a low signal in response to the presence of the trace pulse T on its input. This low output signal, which is also fed to an input of OR gate 52, facilitates the generation of a low signal on the output thereof. OR gate 52 then feeds its low output signal to an input of AND gate 58 which, in response to the low output signal, generates a low signal. This low output signal will hereinafter be referred to as the CLR signal. The CLR signal is then fed to memory counters 60, 62 and 64 (FIG. 2) in order to reset the counters to a count of zero. The CLR signal is also fed to a reset input of a universal asynchronous receiver transmitter (UART) 65 through an inverter 67 to facilitate the clearing thereof. The low output signal from OR gate 52 (FIG. 3) is also fed to an input of flip-flop 66 which causes the output thereof to go to a high state. The high state of flip-flop 66 represents a WRITE mode which hereinafter will be referred to as the write signal Q. The write signal Q is fed to (1) an inverter 68 in order to generate a read signal Q' and (2) A-to-D converter 38 (FIG. 2) through buffer 69 in order to enable the converter during the WRITE mode. Additionally, the write signal Q is fed through an inverter 70 (FIG. 3) to an input of flip-flop 72 which then generates a high output signal. A light emitting diode 74 is extinguished in response to the presence of the high output signal of the flip-flop 72. The flip-flop 72 feeds its high output signal (1) to an input of an AND gate 76 over line 78, (2) to multivibrator 54 over lines 78 and 56 as a disabling signal, and (3) through inverter 80 to a set input of the flip-flop 48 which then feeds a high output signal over line 50 to the OR gate 52. The output of the OR gate 52 then changes to a high state and is fed to the AND gate 58. In response to the high state of the output of the OR gate 52, the CLR signal present at the output of the AND gate 58 changes to a high state. The flip-flop 72 also feeds its high output signal present on line 83 to a line driver 82 in FIG. 2 in order to enable the subsequent transmission of signals to a modem 20. The high output signal present on line 83 and fed to line driver 82 will hereinafter be referred to as the end of transmission (EOT) signal.

Transmitter circuit 18 also includes a sample frequency circuit, designated generally by the numeral 84 (FIG. 3), which generates a plurality of predetermined frequency signals. A 10 MHz oscillator 86 in conjunction with binary counters 88 and 90, OR gates 92, 94 and 96 and NAND gate 98 facilitate the generation of 10 MHz, 1 MHz and 100 KHz clock sample frequencies. Switch 100 facilitates the selection of one of the clock sample frequencies which hereinafter will be referred to as a CLKA signal. The CLKA signal and the write signal Q are fed to inputs of an AND gate 102 (FIG. 3). The CLKA signal thereafter, is coupled to an input of an AND gate 102 and is fed through an OR gate 104 to an input of the AND gate 76 in response to the high state of the write signal Q. The CLKA signal present on one input of the AND gate 76, and the high output signal of flip-flop 72 appearing on line 78 and coupled to the other input of the AND gate 76 generates a signal CLK on the output of the AND gate 76. The CLKA signal and signal CLK are identical signals whenever the transmitter circuit 18 operates in the WRITE mode. Signal CLK is fed (1) to clock memory counters 60, 62 and 64 (FIG. 2) which generate a count which facilitates the addressing of a memory circuit 105 for storage of digital equivalent signals therein, (2) through an inverter 106 to a clock input of a register 108, and (3) through inverters 106 and 110 to an input of a multivibrator over line 114. Since circuit 18 is now operating in the WRITE mode, the register 108 is disabled by the write pulse Q being in a high state and the multivibrator 112 is enabled as a result of the read pulse Q' being in a low state. The presence of the CLK signal on line 114 then facilitates the generation and feeding of a plurality of storage pulses to a write enable input of memory circuit 105 over line 116.

As noted above, the vertical channel signal, which is fed to amplifier 36 in FIG. 2, is then fed to the A-to-D converter 38. During the WRITE mode, the converter 38 feeds digital equivalent signals to the memory circuit 105 for storage therein as words each containing seven bits. The digital equivalent signals of the vertical channel signal are stored in bits zero through five of each word in memory circuit 105 at the address established by the memory counters 60, 62 and 64 in response to storage pulses from multivibrator 112. The trace pulse T, corresponding to the time base signal, is stored in bit six of each word in memory circuit 105. The trace pulse T, the write signal Q and the CLR signal are fed to a NAND gate 118 (FIG. 3). During the WRITE mode, the write pulse Q, the CLR signal and the trace pulse T are all in a high state. The output of NAND Gate 118 is a low signal which is fed through buffer 120 over line 122 to memory circuit 105 (FIG. 2) for storage in bit six of each word stored therein.

Once the storage process has been initiated, the amount of information stored is a function of the timebase setting of the source oscilloscope 16. This limitation is done to minimize the time required to transmit the stored signal to the remote site. For purposes of illustration, if the timebase setting is 2 microseconds/centimeter or less, only 256 words of information will be stored and transmitted. At a baud rate of 300, 256 words will take 8.5 seconds to transmit to the remote site. A mechanism to control the storage time is to enable monostable multivibrator 124 (FIG. 3) when an end of scan (EOS) signal or the retrace pulse T' is detected. The EOS signal is generated when the memory counters 60, 62 and 64 (FIG. 2) reach a count of 256. The EOS signal is fed from the counter 62 to the multivibrator 124 (FIG. 3) over line 126 as a negative-going signal. The output of the multivibrator 124 is normally in a high state. The negative-going EOS signal causes the multivibrator 124 to temporarily change to a low state. This low state on the output of the multivibrator 124 causes the output of flip-flop 128 to go to a high state which enables multivibrator 130 (FIG. 3). If at this time or any later time, the retrace pulse T', generated by the inverter 44 goes to a high state, which is then fed through OR gate 132 to an input of a NAND gate 134 when the WRITE mode is in effect, the output pulse of multivibrator 130 will reset flip-flop 66 ending the WRITE mode and initiating a READ mode and will cause the generation of another CLR signal through AND gate 58. If, however, the retrace pulse T' is never generated prior to the memory counters 60, 62 and 64 attaining a predetermined maximum count, the memory counters will feed a maximum count (MC) signal through OR gate 132 (FIG. 3), NAND gate 134 and multivibrator 130 in order to reset flip-flop 66 and end the WRITE mode. For purposes of illustration, a predetermined maximum count of 2048 was used.

After storage of the vertical channel signal has occurred, transmission of the signal to the remote site is initiated by the write pulse Q going to a low state which disables the A-to-D converter 38 and multivibrator 112 (FIG. 2) and enables register 108. Moreover, the read pulse Q' goes to a high state which indicates the transmitter circuit 18 is now operating in the READ mode. The rate of transmission is determined by a timing circuit, designated generally by the numeral 136. Timing circuit 136 includes a timing chip 138 which feeds a signal to an input of a NAND gate 140 and to a clock input of the UART 65. Timing chip 138 is configured to generate a signal at sixteen times the selected rate of transmission or baud rate of circuit 18. For purposes of illustration, a baud rate of 300 was used. The UART 65 feeds a signal via line 150 to NAND gate 140 which indicates whether a transmitter register in the UART is empty and through inverter 144 to an enable input of multivibrator 146. The multivibrator 146 generates and feeds a clock signal, which hereinafter referred to as the CLKB signal, through AND gate 148 (FIG. 3), OR gate 104 and AND gate 76. As noted above, the output of AND gate 76 is CLK signal. Therefore, when circuit 18 operates in the READ mode, the CLK signal and the CLKB signal are identical signals. The CLK signal is then fed to the memory registers 60, 62 and 64 (FIG. 2), to the register 108 through inverter 106, and to the multivibrator 112 through inverters 106 and 110 over line 114. However, the multivibrator 112 is disabled by the high state of the read pulse Q'. The output of the multivibrator 112 on line 116 goes to a high state which disables the write enable of the memory circuit 105 and causes the transfer of the signal stored therein to register 108.

As noted above, each word stored in memory circuit 105 includes the digital equivalent of the vertical channel signal in bits zero through five and the time base gating signal in bit six. During the READ mode each word stored in the memory circuit 105 is fed to register 108. If UART 65 is able to accept data from register 108, a high output signal is fed to NAND gate 140 and inverter 144 over line 150 which enables multivibrating 146 and causes its output to momentarily shift to a low state in response to clock signals from timing chip 138. The low state of the output of multivibrator 146 is fed to the UART 65 in order to enable the loading and storage of data from register 108 therein and to an input of NAND gate 140 in order to block subsequent clock signals from timing chip 138. The UART 65 then feeds a low output signal to the NAND gate 140 and to the multivibrator 146 through inverter 144 over line 150 which disables the multivibrator and which indicates that the UART is not available to accept additional data from register 108. Thereafter, the UART 65 serially transmits the data stored therein over line 152 through line drivers 154, 82 and 156, used to change the amplitude of the digital equivalent signals of the data to an amplitude which is level compatible to an input of the modem 20 (FIG. 1). UART 65 then sends a high output signal over line 150 to enable multivibrator 146 and to allow the loading and storage of additional data into the UART. The transmission sequence is terminated if during the readout of memory circuit 105, bit six of a word read therefrom goes to a high state. Bit six is also fed over line 122 to an input of a NAND gate 158 (FIG. 2) through OR gate 160. A high state of bit six facilities the resetting of flip-flop 72 and the generation of a low output signal at the output thereof. The high state of bit six indicates that at least 256 words have been transmitted. As noted above, the flip-flop 72 feeds its output signal to the line driver 82 (FIG. 2) over line 83. The low output signal of flip-flop 72 causes the output of line driver 82 to go to a high state which terminates transmission irrespective of the state of a signal appearing on its other input. However, if bit six never goes to a high state, flip-flop 72 is reset by the MC signal fed through OR gate 160 to NAND gate 158 when the predetermined maximum count has been attained.

Figure 4:
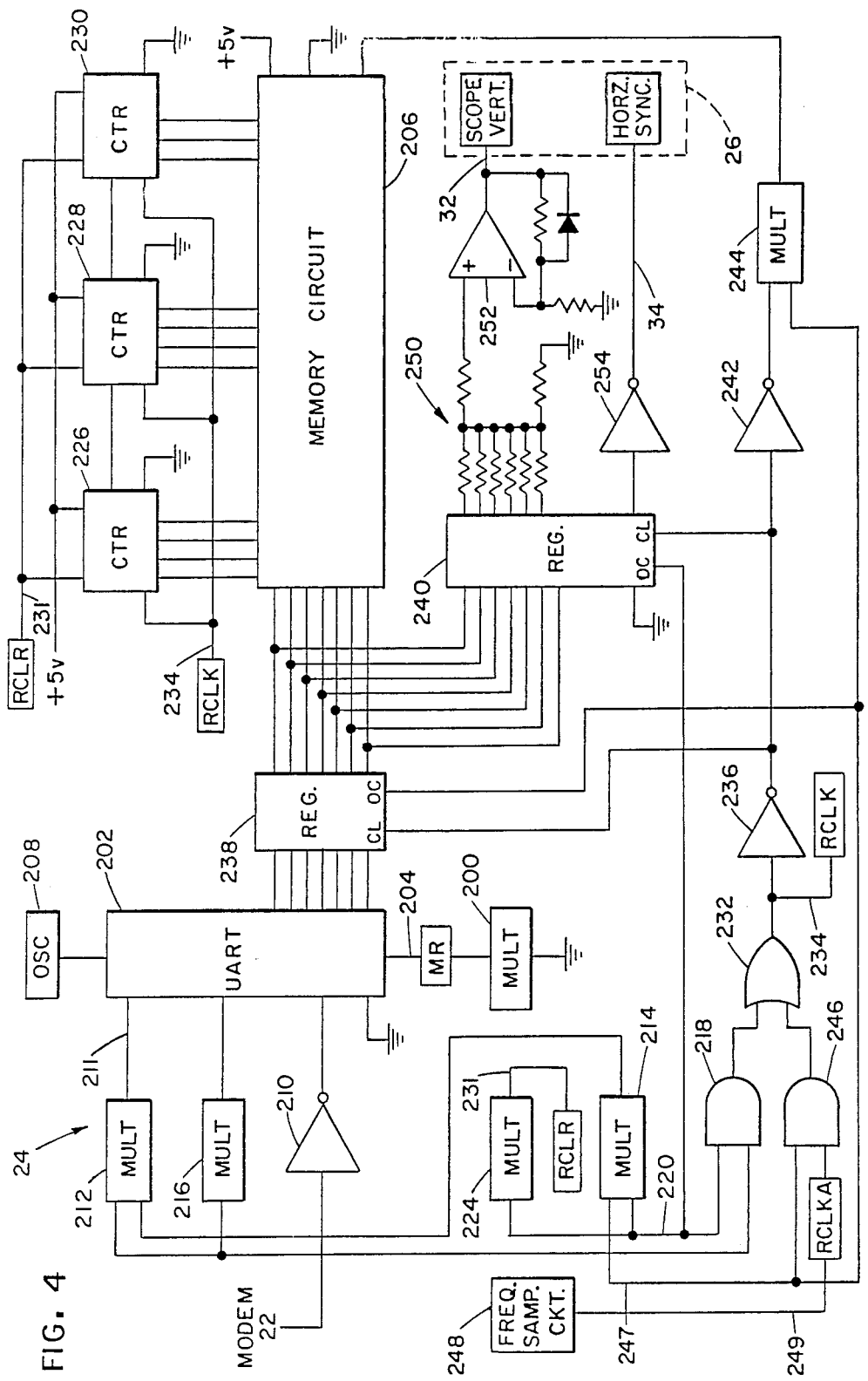

Referring to FIG. 4, there is shown a schematic representation of the receiver circuit 24. The receiver circuit 24 is initialized upon power-up by a multivibrator 200 which feeds a pulse to a master reset input of a UART 202 over line 204. Thereafter, the receiver circuit 24 recycles old data stored in a memory circuit 206 until new data is received from the transmitter circuit 18 (FIGS. 2 and 3). A timing circuit 208, which is similar to timing circuit 136 in FIG. 2, is coupled to and feeds timing signals to the UART 202. Digital equivalent signals, which are generated by the transmitter circuit 18 at a distant location, are fed to the UART 202 through a driver 210. Driver 210 controls a shift in the level of the digital equivalent signals from the incoming level to the level required for logic circuits included within the receiver circuit 24. The UART 202 feeds a high level signal over line 211 to a multivibrator 212 when data is received thereby. The high level signal indicates that a word has been stored within the UART 202. The multivibrator 212 then generates and feeds a positive pulse to a multivibrator 214 and a negative pulse to a multivibrator 216 and an AND gate 218. The multivibrator 216 generates a negative pulse which is fed to UART 202 which in response thereto changes the high level signal present on line 211 to a low level signal. Thereafter, the multivibrator 214 generates and feeds a positive pulse to multivibrator 224 which then generates a receiver clear (RCLR) signal. The RCLR signal is fed to memory counters 226, 228 and 230 over line 231 which resets the counters. The positive pulse generated by the multivibrator 214 is also fed to the AND gate 218 which allows the feeding of negative pulses generated on one output of multivibrator 212 as receiver clock (RCLK) signals through AND gate 218 and OR gate 232. The RCLK signals, which appear on an output of OR gate 232, are fed (1) to memory counters 226, 228 and 230 over line 234, (2) through inverter 236 to registers 238 and 240 and (3) through inverter 242 to an input of multivibrator 244. Additionally, multivibrator 214 feeds the positive pulse to register 240 which disables the register. Multivibrator 214 also generates and feeds a negative pulse to (1) an AND gate 246 over line 247 which blocks the flow of receiver clock pulses (RCLKA) generated by frequency sample circuit 248 and coupled to OR gate 232 and (2) register 238 and multivibrator 244 in order to enable the operation thereof. The frequency sample circuit 248 is similar to construction and operation as circuit 84 of FIG. 3.

As noted above, data received from the transmitter circuit 18 is stored in the UART 202 and is then transmitted in parallel to inputs of register 238. The data is then stored in memory circuit 206 in response to a write enable signal being generated by multivibrator 244 at an address determined by memory counters 226, 228 and 230. Thereafter, upon the receipt of additional data, line 211 goes to a high state which facilitates the generation of a clock signal through AND gate 218 and OR gate 232 which clock signal then enables the generator of addresses for the storage of data thereof in memory circuit 206. Multivibrator 214 is configured so that the duration of the positive and negative signals is longer than the time delay between words of data. Thus, when new data is received, and stored in UART 202, the multivibrator 214, in response to a pulse generated by multivibrator 212, maintains its output in the form of positive and negative level signals until all of the data has been received from the transmitter circuit 18. As a result of the presence of constant level signals on the outputs of multivibrator 214 while data is being received at the selected baud rate, the clear signal, which is generated by multivibrator 224, is only generated when the first bit of data is received.

After all of the data has been received, the signals on the outputs of multivibrator 214 appearing on lines 220 and 247 return to their normally low and high states, respectively. The normally low and high states of the signals facilitate (1) the disabling or register 238 and multivibrator 244 and (2) the enabling of register 240 which terminates the write cycle and initiates a read cycle. Moreover, multivibrator 214 also enables the feeding of clock signals (RCLKA) from the frequency sample circuit 248 over line 249 through AND gate 246 and OR gate 232 which facilitate the operation of memory counters 226, 228, 230 and register 240. Each word stored in the memory circuit 206 is fed to the register 240. Bits zero through five of each of the words are then fed to a binary weighted resistor ladder circuit, designated generally by the numeral 250 for reconstruction into an analog signal. This analog signal is fed to an amplifier 252 having a limited bandwidth in order to provide a smoothing effect on its output signal. This output signal is then fed to a vertical channel input of the receiving oscilloscope 26. Bit six of each of the words is fed through inverter 254 to a horizontal sync input of the receiving scope 26 as a timebase trigger signal. Thereafter, the receiving scope 26 is able to display a representation of the original analog signal which was displayed on source oscilloscope 16 on any timebase or vertical voltage setting since, as noted above, the contents of the memory circuit 206 are recycled continuously until new data is received.

While preferred methods of, and systems for, transmitting oscilloscope signals to a remote location have been disclosed herein, it is obvious that various modifications may be made to the present illustrative embodiments, and that a number of alternative related embodiments could be devised by one skilled in the art without departing from the spirit and scope of the invention.

What is claimed is:

1. A system for receiving oscilloscope signals comprising:
    means for storing incoming digital signals serially transmitted from a remote location as words each identifying both vertical channel and time base gate component signals;
    means for converting the digital signal words stored in the storing means into analog vertical channel and time base gate component signals; and
    means for displaying an oscilloscope signal in response to the analog vertical channel and time base gate component signals.

2. The systems as recited in claim 1 wherein the system further comprises means for generating a plurality of clock pulses;
    and wherein the storing means comprises:
    means, responsive to the clock pulses, for addressing specific storage locations within the storing means;
    means responsive to the clock pulses for developing a write enable signal to enable the storing means to store the digital signal words;
    means, responsive to the absence of the write enable signal, for terminating the storage of the digital signal words in the storing means; and
    means, responsive to the clock pulses for writing to and reading from the storing means.

3. The system as recited in claim 1 wherein the incoming digital signals have a first amplitude level and wherein the storing means includes means for changing the level of the incoming digital signals to a second amplitude level.

4. A method of receiving oscilloscope signals comprising the steps of:
    storing incoming digital signals serially transmitted from a remote location in a memory circuit as words each identifying both vertical channel and time base gate component signals;
    converting the digital signal words stored in the memory circuit into analog vertical channel and time base gate component signals; and
    displaying an oscilloscope signal in response to the analog vertical channel and time base gate component signals.

5. The method as recited in claim 4 further comprises the step of generating a plurality of clock pulses;
    and wherein the storing step comprises:
    addressing, in response to the clock pulses, specific storage locations within the memory circuit;
    developing a write enable signal in response to the plurality of clock pulses to enable the storing of the digital signal words;
    terminating the storage of the digital signal words in response to the absence of the write enable signal; and
    writing to and reading form the memory circuit in response to the plurality of clock pulses.

6. The method as recited in claim 5 wherein the incoming digital signals have a first amplitude level and wherein the step of storing includes the step of changing the level of the incoming digital signals to a second amplitude level.

7. An oscilloscope signal receiver comprising:
   means for receiving serial digital signals and storing said received digital signals as words each identifying both vertical channel and time base gate component signals,
   means for converting said stored digital signal words into analog vertical channel and time base gate component signals and displaying said analog vertical channel and time base gate component signals as an oscilloscope signal, and
   means for recycling said receiving and storing means to enable said converting and displaying means to continuously display said oscilloscope signal.

8. The oscilloscope signal receiver set forth in claim 7 wherein said receiving and storing means comprises
   a receiver and register for receiving said serial digital signals and registering ones of said serial digital signals as parallel bit words.

9. The oscilloscope signal receiver set forth in claim 8 wherein said receiving and storing means comprises
   a memory coupled with said receiver and register for storing said registered parallel bit words.

10. The oscilloscope signal receiver set forth in claim 9 wherein said converting and displaying means comprises
    a converter coupled with said memory for converting one of said bits of each stored word into the time base gate component signal and predetermiend others of stored word bits into the analog vertical channel signal.

11. The oscilloscope signal receiver set forth in claim 10 wherein said recycling means comprises
    means for continuously cycling said memory to read each stored word from said memory into said converter to convert said bits of each stored work into said analog vertical channel and time base gate component signals and continuously displaying said analog vertical channel and time base gate component signals as said oscilloscope signal.

12. A method of reeiving oscilloscope signal scomprising the steps of:
    receiving serial digital signals and storing said received digital signals as words each identifying both vertical channel and time base gate component signals,
    converting said stored digital signal words into analog vertical channel and time base gate component signals and displaying said analog vertical channel and time base gate component signals as an oscilloscope signal, and
    cycling said stored digital signal words and converting said cycled stored digital signal words into analog vertical channel and time base gate component signals and displaying said analog vertical channel and time base gate component signals as a continuous oscilloscope signal.

13. The method of receiving oscilloscope signals set forth in claim 12 wherein said receiving and storing step comprises the steps of:
    receiving said digital signals in a serial format, and
    registering ones of said received serial digital signals as parallel bit words.

14. the method of receiving oscilloscope signals set forth in claim 13 wherein said receiving and storing step comprises the step of
    storing each of said registered parallel bit words.

15. The method of receiving oscilloscope signals set forth in claim 14 wherein said converting and displaying step comprises the steps of:
    converting one of each stored word bits into a time base gate component signal, and
    converting predetermined others of stored word bits into an analog vertical channel signal.

16. The method of receiving oscilloscope signals set forth in claim 15 wherein said cycling and displaying step comprises the steps of
    continuously cycling said stored words and converting each cycled stored word bits into said analog vertical channel and time base gate component signals and continuously displaying said analog vertical channel and time base gate component signals as said oscilloscope signal.

* * * * *